United States Patent
Kunnen et al.

(10) Patent No.: US 9,502,264 B2
(45) Date of Patent: Nov. 22, 2016

(54) METHOD FOR SELECTIVE OXIDE REMOVAL

(71) Applicant: IMEC VZW, Leuven (BE)

(72) Inventors: Eddy Kunnen, Kessel-Lo (BE); Vasile Paraschiv, Kessel-Lo (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/827,774

(22) Filed: Aug. 17, 2015

(65) Prior Publication Data

US 2016/0049310 A1 Feb. 18, 2016

(30) Foreign Application Priority Data

Aug. 18, 2014 (EP) ..................................... 14181242
Oct. 23, 2014 (EP) ..................................... 14190146

(51) Int. Cl.
| | | |
|---|---|---|
| H01L 21/302 | (2006.01) | |
| H01L 21/311 | (2006.01) | |
| C01B 35/06 | (2006.01) | |
| C09K 13/00 | (2006.01) | |
| H01L 21/768 | (2006.01) | |

(52) U.S. Cl.
CPC ....... *H01L 21/31144* (2013.01); *C01B 35/061* (2013.01); *C09K 13/00* (2013.01); *H01L 21/31116* (2013.01); *H01L 21/76897* (2013.01)

(58) Field of Classification Search
CPC .................... H01L 21/31114; H01L 21/31116; H01L 21/76897
USPC ....... 438/637, 689, 694, 706, 738, 774, 712; 216/37, 67
See application file for complete search history.

(56) References Cited

U.S. PATENT DOCUMENTS

| | | | |
|---|---|---|---|
| 5,827,437 A * | 10/1998 | Yang ................ | H01L 21/32136 216/64 |
| 6,331,495 B1 | 12/2001 | Becker | |
| 7,785,486 B2 * | 8/2010 | Urban ................ | B81C 1/00579 216/59 |
| 2001/0019866 A1* | 9/2001 | Jang ................. | H01L 21/31116 438/241 |
| 2005/0153563 A1 | 7/2005 | Ramalingam et al. | |
| 2005/0181588 A1* | 8/2005 | Kim ................. | H01L 21/02063 438/586 |
| 2007/0249182 A1* | 10/2007 | Mani ................. | H01L 21/31116 438/785 |

OTHER PUBLICATIONS

Kwon et al. Journal of Korean Physical Society, vol. 58, No. 3, Mar. 2011, pp. 467-471.*
Kwon, Kwang-Ho et al., "On the Dry Etch Mechanisms of Y2O3, SiO2, and Si3N4 in a Cl2/BCl3 Inductively Coupled Plasma", Journal of the Korean Physical Society, vol. 58, No. 3, Mar. 2011, pp. 467-471.
Sha, Lin et al., "Plasma Etching Selectivity of ZrO2 to Si in BCl3/Cl2 Plasmas", Journal of Vacuum Science & Technology, A21(6), Nov./Dec. 2003, pp. 1915-1922.

* cited by examiner

*Primary Examiner* — Duy Deo
*Assistant Examiner* — Maki Angadi
(74) *Attorney, Agent, or Firm* — McDonnell Boehnen Hulbert & Berghoff LLP

(57) ABSTRACT

A method for removing oxide selective to a material comprising at least silicon and at least nitrogen is disclosed, the method comprising providing in a reactor a structure having a surface comprising a region, wherein said region comprises a material comprising at least silicon and at least nitrogen, providing on said structure an oxide layer overlying at least a part of said region, and removing said oxide layer selective to said material by etching, thereby exposing at least a part of said at least overlaid part of said region, wherein said etching is done only by providing an etchant gas comprising boron, whereby a voltage bias lower than 30 V is applied to the structure.

14 Claims, 11 Drawing Sheets

METHOD FOR SELECTIVE OXIDE REMOVAL

CROSS-REFERENCE TO RELATED APPLICATIONS

This application claims priority from EP 14181242.0, filed Aug. 18, 2014, and from EP 14190146.2, filed Oct. 23, 2014, which are incorporated by reference in its entirety.

TECHNICAL FIELD OF THE INVENTION

The present invention is related to the field of material removal. More specifically, it is related to a method for removing oxide on a structure selective to a material comprising at least silicon and at least nitrogen. The present invention also relates to removing oxide of a semiconductor structure selective to a material comprising at least silicon and at least nitrogen, in semiconductor processing.

BACKGROUND OF THE INVENTION

Selective material removal refers to being able to remove one material preferentially over another by means of a material removal technique when these materials are subjected to the same material removing environment. Even though there are various material removal techniques, etching is one of the most commonly known and used technique in industry including semiconductor industry.

In semiconductor industry, etching oxide selective to nitride is required for various purposes, including etching contact holes through the oxide selective to nitride spacers and/or nitride gate cap to form a contact to source and drain regions of the transistor. For these purposes, state of the art etching of oxide selective to nitride, including contact etching, is carried out in a dry etch plasma reactor using a gas mixture comprising carbon-fluor-hydrogen based gases such as $C_4F_6$, $C_4F_8$, $CF_4$, $CH_2F_2$ or mixtures thereof.

Selectivity is a key parameter when referring to selective removal of a material over another. One of the mechanisms of achieving selectivity is the selective formation of an etch-inhibiting layer on one of the materials, while the other material is further being etched. When gas mixtures comprising above-mentioned carbon-fluor-hydrogen based gases are used to selectivity etch oxide with respect to silicon nitride, usually this mechanism occurs. A blocking polymer layer is formed on the silicon nitride inhibiting further etching thereof, while oxide is being etched until the desired depth into the oxide is reached. About 5 nm to 10 nm of the silicon nitride will be consumed before such an etch inhibiting layer can be built up. However, such a high consumption of silicon nitride cannot be tolerated for contact etching, where the nitride of the sidewalls spacer and/or gate cap is deemed to be consumed, especially in the processing of advanced technology nodes. Such a consumption of the nitride of the sidewalls spacer and/or nitride cap leads exposure of the gate electrode resulting in an electrical shorting of the gate electrode with the source or the drain region after establishing the electrical contact.

A possible solution to cope with this problem has been disclosed in U.S. Pat. No. 6,331,495 B1. The gate stacks are wrapped by a bi-layer consisting of a first layer of un-doped $SiO_2$, over which a second bread-loafed layer of $SiO_2$ or nitride is deposited. Such a solution is feasible for higher technology nodes, where the gate pitch is on the order of 60 nm or higher. However, as technology nodes are getting smaller following CMOS scaling in accordance with Moore's law, gate pitch is also shrinking to about 60 nm or lower for 10 nanometer technology node or and smaller nodes. This means that such a bread-loafed profile poses the risk of having merged corners, thus jeopardizing or putting extra undesired challenges to the contact etch process.

There is, therefore, a need in the art to remove oxide selective to nitride using a method such that a viable contact etch process can be achieved independent of the technology node, even for technology nodes equal to or smaller than the 10 nanometer technology node in the semiconductor industry.

SUMMARY OF THE INVENTION

It is an object of embodiments of the present invention to provide methods for removing oxide selective to a material comprising at least silicon and at least nitrogen. The above objective is accomplished by the methods and uses of an etchant gas according to the present invention.

In a first aspect, the present invention relates to methods for removing oxide selective to a material comprising at least silicon and at least nitrogen. The method comprises providing in a reactor a structure having a surface comprising a region and providing an oxide layer on this structure. This oxide layer overlies at least a part of this region. This region comprises a material comprising at least silicon and at least nitrogen. The oxide layer is removed selective to this material by etching, thereby exposing at least a part of the at least overlaid part of this region. Etching is done only by providing an etchant gas, in the presence of a voltage bias lower than 30 V that is applied to the structure. This etchant gas comprises boron.

In embodiments, providing on this structure an oxide layer overlying at least a part of this region may comprise depositing an oxide layer on this structure. Following the deposition of this oxide layer, a chemical mechanical planarization process (CMP) is done to planarize this oxide layer. On this planarized oxide layer, a photoresist layer may be deposited. This photoresist layer is patterned by a lithography process. Pattern transfer into this planarized oxide is done by etching, whereby this etching may also be done using the etchant gas comprising boron to thereby obtain an oxide layer overlying at least a part of this region. Subsequent to this etching, a strip process is done to remove the remaining photoresist residues.

It is an advantage of embodiments of this invention that the thickness of this material can be preserved after etching is completed. This provides further advantage to use this method for processes where, the need for protecting this material by depositing extra layers over this material can be avoided.

It is further an advantage of embodiments of this method, that it allows for having this material at a reduced thickness during the etch process. Having a reduced thickness of this material may be required by the processes related with the technology of choice. The motivation for reduced thickness can be to reduce material cost and/or manufacturing cost, to overcome technology related issues arising from thicker material or due to increased density, i.e. reduced spacing, of structures comprising this material.

Moreover, when a voltage bias lower than 30 V to the structure is applied in the reactor during etching sputtering of this material is avoided. Hence, if this material is patterned to have a particular geometry, then this geometry can be preserved, or in other words, undesired and intolerable consumption of this material that leads to geometry loss can be eliminated. Furthermore, applying a voltage bias lower than 30 V to the structure enables anisotropic etching of said oxide layer. By anisotropic etching, said oxide layer is etched with a different etch rate in the vertical direction as compared to the lateral direction. Typically, the etch rate in the vertical direction is higher than the etch rate in the lateral direction. Preferably, this voltage bias is lower than 20 V. More preferably, this voltage bias is lower than 10 V.

It is further an advantage that methods according to embodiments of the present invention allows etching of oxide selective to this material, which makes it particularly suited for realizing different process modules of ultra large scale integration (VLSI) manufacturing in the semiconductor industry.

In a method according to embodiments of the present invention, this boron-comprising etchant gas consists of a mixture of $BCl_3$ and $Cl_2$.

The inventors have observed that using a gas mixture consisting of $BCl_3$ and $Cl_2$ etches oxide selective to this material in the presence of a voltage bias lower than 20 V, preferably lower than 10 V.

This etchant gas may be provided into the reactor using a carrier gas. This carrier gas is an inert gas can be $N_2$ or Ar. Preferably, this inert gas is $N_2$.

In a method according to embodiments of the present invention, this material is selected from a group consisting of SiON, SiCN, and $Si_xN_y$ with x and y being real numbers whereby x+y=1. Preferably, this material is $Si_xN_y$, with $1<y/x<2$. More preferably, this material is $Si_3N_4$.

In preferred embodiments of the present invention, this structure is a semiconductor structure. This semiconductor structure is used for the manufacturing of Field Effect Transistors (FETs). In these embodiments, removing the oxide layer comprises creating a vertical opening through this oxide layer overlying at least part of this region.

Alternatively, this semiconductor structure is useful for the manufacturing of, for example, Micro and/or Nano Electro-Mechanical Systems (MEMS and/or NEMS).

According to a particular embodiment of the present invention, this vertical opening is a contact hole.

In preferred embodiments of the present invention, this contact hole further exposes at least a part of a contact area located adjacent to this overlaid part of this region.

In preferred embodiments of the present invention, this etching is a self-aligned contact etch.

The method is particularly suitable for self-aligned contact (SAC) etch, thus facilitating the formation of self-aligned contacts at dense gate pitch, for example 58 nm.

According to a particular embodiment of the present invention, this semiconductor structure comprises a semiconductor substrate. This semiconductor substrate can be bulk Si, silicon on insulator (SOI) or germanium.

A semiconductor feature protrudes from this semiconductor substrate. At least two multilayered structures separated by this contact area are positioned on this semiconductor feature. Each of these multilayered structures has an insulating cap on top of it and insulating spacers adjacent to each sidewall. This insulating cap and these insulating spacers are both made from this material. The method further comprises providing, on this oxide layer, a layer comprising a gap exposing this oxide layer, before removing this oxide layer. Projection of this gap onto the semiconductor structure coincides with at least a part of this contact area and at least a part of this material.

In preferred embodiments, these two multilayered structures are gate structures or gate electrodes comprising a gate dielectric and a gate metal.

It is an advantage of the method according to embodiments of the present invention that a critical distance of 6 nm between the gate electrode and the contact metal, which is deposited into this contact hole, is preserved. This, therefore, allows for long term device reliability. Preservation of this critical distance is provided by preserving the geometry and the thickness of the insulating cap and the insulating spacers during selective etching of oxide towards this material as provided by this method.

In embodiments, providing, on this oxide layer, a layer comprising a gap may include, in a first step, depositing a mask layer on this oxide layer. Preferably, this mask layer is a hard mask layer. Alternatively, this mask layer may comprise multiple layers.

Then a layer comprising patterned features is provided on this mask layer. Providing this layer comprising patterned features comprises performing at least one lithography process. Depending on the lithography process used, this layer comprising patterned features can be a photoresist layer, a spacer pattern or a component of a block co-polymer. This lithography process may be a deep ultra violet (DUV) lithography, extreme ultra violet (EUV) lithography or any one of double or multiple patterning techniques such as self-aligned-double patterning (SADP), self-aligned-quadruple patterning (SAQP) or directed self-assembly (DSA).

In a third step, the transfer of the pattern of this layer into the underlying mask layer is done by an etch process, thereby creating this gap.

Subsequently, in a fourth step, the layer comprising patterned features is removed.

In embodiments, said reactor may be a capacitively coupled plasma (CCP) reactor or a inductively coupled plasma (ICP) reactor and power of said reactor is pulsed. Pulsing the power of said CCP reactor or said ICP reactor has the advantage that the ion energy is reduced such that, in return, sputtering of this material is reduced or diminished.

In an embodiment, supply of said boron-comprising etchant gas to said reactor is pulsed. Pulsing supply of said boron-comprising etchant gas to said CCP or ICP reactor helps further in reducing or diminishing the sputtering of this material.

In a particular embodiment, said reactor may be an ion beam or a neutral beam reactor. Said ion beam or said neutral beam reactor has the advantage that there is no self-bias voltage. Due to the absence of self-bias voltage, ion energies can be controlled by applying a voltage towards the wafer that is lower than the value of the self-bias voltage. This applied voltage gives directionality to the ions. Said ion beam or neutral beam reactor has the advantage that sputtering or loss of said material during selective oxide etching is reduced or diminished.

In a second aspect of the present invention, use of an etchant gas for removing oxide selectively to a material comprising at least silicon and at least nitrogen is disclosed. This etchant gas comprises boron. In preferred embodiments of the present invention, this etchant gas is a mixture consisting of $BCl_3$ and $Cl_2$. In preferred embodiments of the present invention, this material is selected from a group consisting of SiON, SiCN, $Si_xN_y$. Preferably, this material is $Si_xN_y$, with $1<y/x<2$. More preferably, this material is $Si_3N_4$.

BRIEF DESCRIPTION OF THE FIGURES

FIG. 1b is a flowchart representing a step of the method represented in the flowchart of FIG. 1a.

DETAILED DESCRIPTION OF THE INVENTION

Figure 1A:
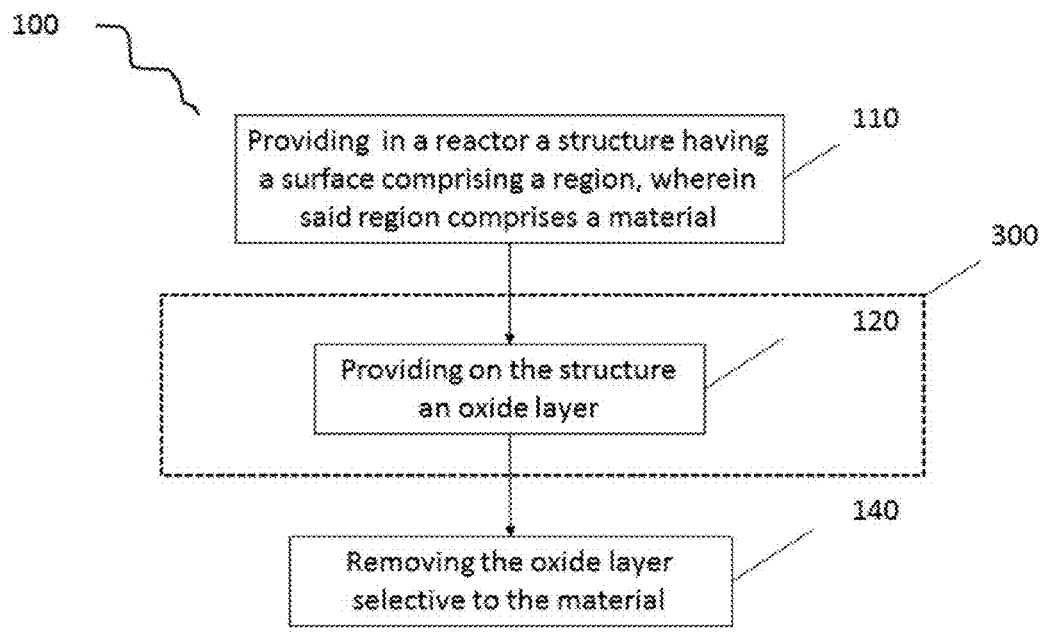
FIG. 1a is a flowchart representing a method according to an embodiment of the present invention.

The present invention will be described with respect to particular embodiments and with reference to certain drawings, but the invention is not limited thereto but only by the claims. The drawings are only schematic and are non-limiting.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the invention.

As used herein and unless provided otherwise, the term "self-aligned contact etching" refers to opening a vertical hole through an oxide layer in order to create a contact hole. The shape of this contact hole can be round, in the form of a square trench or irregular. This oxide layer is usually referred to as pre-metal dielectric (PMD). This PMD layer can be doped. In integrated circuit (IC) manufacturing an etch process being self-aligned refers to the situation, where a part of the deposited insulating layer is resistant to the etch process, for example used to etch the silicon dioxide layer or BPSG (boronphosphosilicateglass) layer of the pre-metal dielectric.

As used herein and unless provided otherwise, the term "gate pitch" refers to the summation of the width of a gate and the distance between this gate and the neighboring gate.

As used herein and unless provided otherwise, the term "critical distance" refers to the minimum distance allowed between the gate and the metal of the contact in order to prevent electrical breakdown of the transistor. This critical distance is scaled in accordance with the scaling in the technology node in the semiconductor industry.

As used herein and unless provided otherwise, the term "etching species" refer to the plasma source that can be either charged, such as ions, or neutral, such as atoms or radicals. Typically, in an etch plasma, two types of species are present. These species can be either charged, such as ions, or neutral, such as atoms, molecules and radicals.

The invention will now be described by a detailed description of several embodiments. It is clear that other embodiments of the invention can be configured according to the knowledge of a person skilled in the art without departing from the technical teaching of the invention, the invention being limited only by the terms of the appended claims.

FIG. 1a is a flowchart representing a method according to an embodiment of the present invention.

The method (100) starts with (110) providing a structure (500) having a surface (10) in a reactor. This surface comprises a region (30). This region comprises a material (20) comprising at least silicon and at least nitrogen. In embodiments, this region refers to a part or to a section of the surface of this structure. Alternatively, in embodiments this region may refer to the complete surface of this structure. This material comprising at least silicon and at least nitrogen is selected from a group consisting SiON, SiCN and $Si_xN_y$ with $1<y/x<2$. Preferably, this material is $Si_xN_y$ with $1<y/x<2$. More preferably, this material is $Si_3N_4$. If $Si_xN_y$ is deposited by low pressure chemical vapor deposition (LPCVD), it can contain up to 8% hydrogen. Various ternary compounds of silicon, nitrogen and hydrogen, which are denoted as $SiN_xH_y$, are, for example, used as insulating layers. In alternative embodiments, this material comprising at least silicon and at least nitrogen is selected from a group consisting SiON, SiCN, $Si_xN_y$ and $SiN_xH_y$.

Thereafter (120), an oxide layer (50) is provided on this structure (500). This oxide layer (50) overlies at least a part (35) of this region (30). Preferably, this oxide layer is $SiO_2$. In an integrated semiconductor circuit this oxide layer may function as a pre-metal dielectric (PMD), into which contact holes are formed. By depositing a contact metal into these contact holes, source and drain of the transistor present in the front-end-of-line (FEOL) are connected to the interconnects present in the back-end-of-line (BEOL) of an integrated circuit. Alternatively, this oxide layer may function as an interlayer dielectric (ILD), which is placed in between different metal levels/metal interconnects in the back-endof-line (BEOL) within multilevel metallization of very large scale integration (VLSI) and ultra large scale integration (ULSI).

Then (140), this oxide layer (50) is removed selective to this material (20) by etching. As a result of this etching, at least a part (60) of this at least overlaid part (35) of this region (30) is exposed. The inventors have found that a boron-comprising etchant gas etches oxide selective to this material. More specifically, this etchant gas consists of a mixture of $BCl_3$ and $Cl_2$. This etchant gas may be provided into the reactor using a carrier gas. This carrier gas is an inert gas and can be $N_2$ or Ar. Preferably, this inert gas is $N_2$. Furthermore, etching is carried out in the reactor when biasing the structure to a voltage bias lower than 30 V. Applying a voltage bias lower than 30 V provides anisotropy during etching, which is done to remove said oxide layer selective to this material (20). Thus, anisotropic etching is achieved. Anisotropic etching refers to etching when the etch rate differs with respect to different directions. Preferably, this voltage bias is lower than 20 V. More preferably, this voltage bias is lower than 10 V.

In state-of-the-art technology, selective etching of oxide with respect to silicon nitride is carried out in a capacitively coupled plasma (CCP) reactor, using a gas mixture comprising carbon-fluor-hydrogen based gases such as $C_4F_8$ and/or $C_4F_6$ together with Ar or $O_2$. The CCP reactor is a direct plasma reactor, meaning that the structure to be etched is directly exposed to the plasma and its products. The CCP reactor consists of two parallel metal electrodes separated by a small distance. The CCP reactor is driven by a single or multiple frequency (RF) power supply. This etching mechanism requires the building of a polymer layer on the layer to be protected from the etch plasma. This layer is present on the etch front while etching oxide. At arrival of the plasma on the nitride, nitride is etched easier than the oxide. Etching of nitride continues, whereby the protective polymer layer thickens up and slows down further etching of nitride, ideally stopping the nitride etch process. Etching of silicon nitride until the formation and thickening of such protective polymer layer results in intrinsic silicon nitride loss. To avoid this kind of silicon nitride loss, selectivity has to be generated in a different manner. Furthermore, in a CCP reactor ion energies can vary up to more than 100 eV during selective etching of oxide with respect to nitride. However, under such high ion energies, due to ion bombardment there is a significant sputtering of the silicon nitride material. This means, in situations where selective etching of oxide with respect to patterned silicon nitride structures has to be carried out, this sputtering may lead to geometry loss and/or chopping of corners of such patterned silicon nitride structures.

By using a boron-comprising etchant gas, preferably, an etchant gas consisting of a mixture of $BCl_3$ and $Cl_2$, the selectivity mechanism does not rely on the formation of such a polymer layer anymore. Removing the energetic ions requires the wafer surface to be at a higher temperature to let the etch reaction take place. Typically the wafer surface temperature is regulated by controlling the chuck temperature on which the wafer is sitting. The bond between the silicon atom and the oxygen is about 800 kJ/mol indicating that it is a relatively strong bond. Etching this material requires the bond to be broken so that the atoms can bond to the species from the etchant. During etching at room temperature, this energy is typically delivered by the energetic ions. In the absence of the energetic ions, the temperature can be elevated in order to provide the energy so the atoms can react. Temperatures used in common plasma-based etch and deposition reactors can go up to few hundreds of degrees Centigrade. It is observed that the reaction already takes place at 120° C. chuck temperature. Higher etch rates are expected at higher temperatures than 120° C. When using temperature to let the reaction take place, the wafer enters the chamber on the chuck and the chuck temperature is increased. When temperature is stabilized at the desired chuck temperature, the etching species are supplied. The heat transfer between the chuck and the wafer is facilitated by the presence of He in between the chuck and the wafer at a pressure in the range of 1 Torr to 100 Torr. Preferably, this He pressure is 20 Torr. The temperature of relevance is the wafer surface temperature and caution should be taken by regulating the chuck temperature since heat transfer at reduced pressure is limited. No major temperature delay is expected by the silicon wafer. The ramping rate of the chuck temperature is about 1° C./second.

The wafer surface temperature is in the range of 100° C. to 600° C. Preferably, the wafer surface temperature is in the range of 100° C. to 400° C. More preferably, the wafer surface temperature is in the range of 100° C. to 200° C.

The pressure in the reactor during the etching is in the range of 0.01 mTorr to 10 Torr. Preferably, the pressure in the reactor is in the range of 1 mTorr to 1 Torr. More preferably, the pressure in the reactor is in the range of 1 mTorr to 10 mTorr.

The flow of $BCl_3$ and $Cl_2$ is each in the range of 1 sccm to 10000 sccm. Preferably, the flow of $BCl_3$ and $Cl_2$ is each in the range of 1 sccm to 1000 sccm. More preferably, the flow of $BCl_3$ and $Cl_2$ is each in the range of 1 sccm to 100 sccm.

The supply of $BCl_3$ and $Cl_2$ occurs via different lines to the reactor. At the reactor, these gases are mixed at a predetermined ratio suitable to provide selective etching of oxide with respect to silicon nitride and supplied into the etching chamber as the etchant gas mixture.

In alternative embodiments, $BCl_3$ and $Cl_2$ may be supplied in an alternating fashion into the etching chamber of the reactor. In these embodiments, the inert gas or the noble gas may be supplied together with $BCl_3$ and/or $Cl_2$. In a particular embodiment, this reactor is an ion or neutral beam reactor. An ion or neutral beam reactor is a remote plasma reactor. In such a reactor the wafer is not in direct contact with the plasma and therefore there is no self-bias voltage (0-30V). Hence there is no charging of the structure immersed in a plasma that leads to a minimal voltage difference of 0-30V between the structure and the plasma. Directionality can be achieved by ionization and acceleration of the ions with a voltage towards the wafer. Due to the absence of the self-bias voltage, ion energies can be controlled below the self-bias voltage.

In another particular embodiment, this reactor may be a CCP reactor. In a CCP reactor, the ion energies can vary up to more than 100 eV during selective etching of oxide with respect to nitride leading to silicon nitride loss. However, lower ion energies may be obtained by pulsing the power of the reactor. Thus, by providing the etchant gas comprising boron according to the embodiments of this invention to a CCP reactor while pulsing the power of the reactor, improvement in selective oxide removal with respect to nitride with reduced silicon nitride loss may be obtained. Optionally, together with pulsing the power of this reactor, gas supply of boron comprising etchant gas may also be pulsed.

In yet another particular embodiment, this reactor may be an inductively coupled plasma reactor (ICP). In an ICP reactor, high density plasma is generated where the source (RF) power is inductively coupled to the plasma providing high ion density and low ion energy. In such a reactor, independent control of the ion energy and ion flux may be obtained. Typically, the source power is much larger than the bias power, which is applied to the electrode. In this way, bias power does not contribute significantly to the plasma density and the ion flux is independent of bias power. Pulsing the powers only or as well as with pulsing the boron comprising etchant gas supply may achieve improvement in selective oxide removal with respect to nitride. Achieving improvement in selective oxide removal with respect to nitride refers to reducing or diminishing sputtering of nitride.

The optimal pulse-on and pulse-off times for pulsing power may be adapted accordingly with respect to the supply of the boron comprising etchant gas. Thus, the power of the reactor may be pulsed when the boron comprising etchant gas is being supplied to the reactor. The power of the reactor during the pulse-off time may be set to zero. The power of the reactor during the pulse-off time may also be set to a power value lower than the one used during the pulse-on time and higher than a value of zero.

Furthermore, the pulse-on and pulse-off times for pulsing power may be adapted according to the pulse-on and pulse-off times of the supply of the boron comprising etchant gas in the case when supply of boron comprising etchant gas is pulsed as well as pulsing of the power. This adaptation is such that sputtering of nitride is reduced or diminished during selective oxide removal with respect to nitride. The supply of boron comprising etchant gas during the pulse-off time may be set to a gas supply of zero. The supply of boron comprising etchant gas during the pulse-off time may also be set to a value lower than the one used during the pulse-on time of gas supply and higher than a value of zero.

Figure 1B:
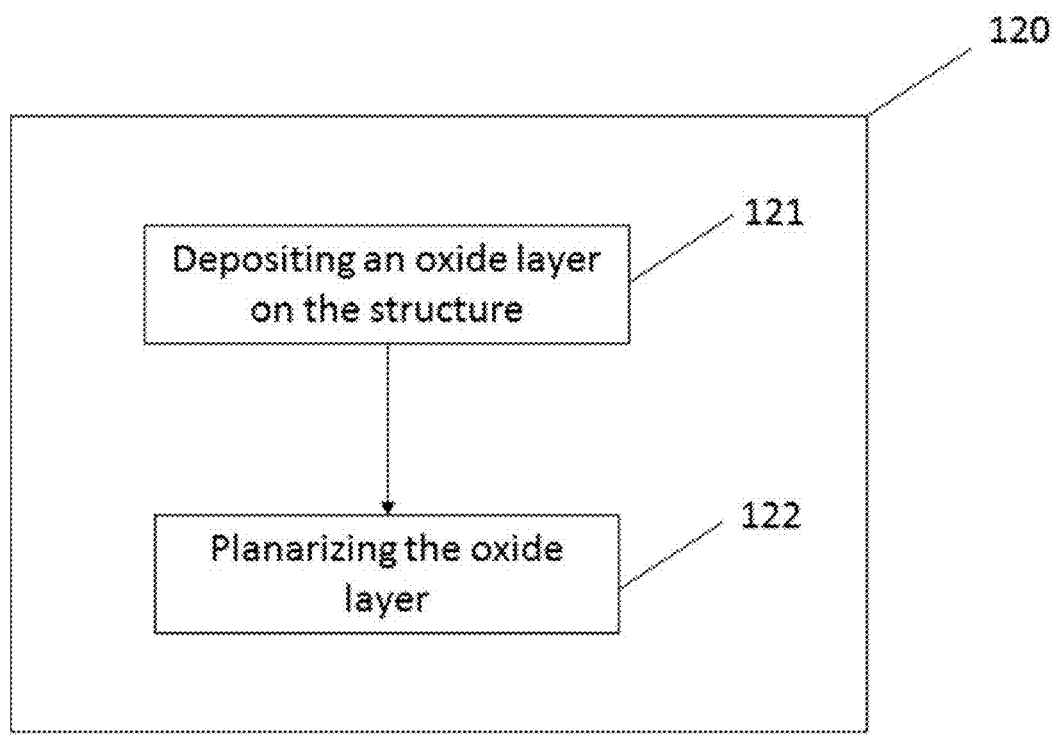

FIG. 1b is a flowchart representing a step of the method represented in the flowchart of FIG. 1a. The step (120) of providing on this structure an oxide layer comprises a deposition process (121). This oxide can be deposited by CVD, PECVD, PEALD or ALD techniques or a combination of them. A variety of deposition techniques is used depending on the requirements for deposition such as temperature budget or aspect ratio filling capabilities. After deposition of this oxide, a chemical mechanical planarization process (CMP) (122) is performed. CMP reduces the thickness of the deposited oxide layer and provides a planar surface. The thickness of the planarized oxide layer may depend on its function. In preferred embodiments, this oxide layer is used as a PMD layer. In these embodiments, the thickness of this oxide layer ranges in between 20-200 after CMP is completed. The oxide thickness after CMP strongly depends on the integration scheme. For example, for regular contact etch used in the 65 nm technology node, the thickness of oxide after CMP is about 200 nm. Contacts are etched from that level reaching the top of the gate and source region and drain region. For 10 nanometer technology node, the thickness of PMD is about 40 nm.

Figure 2:
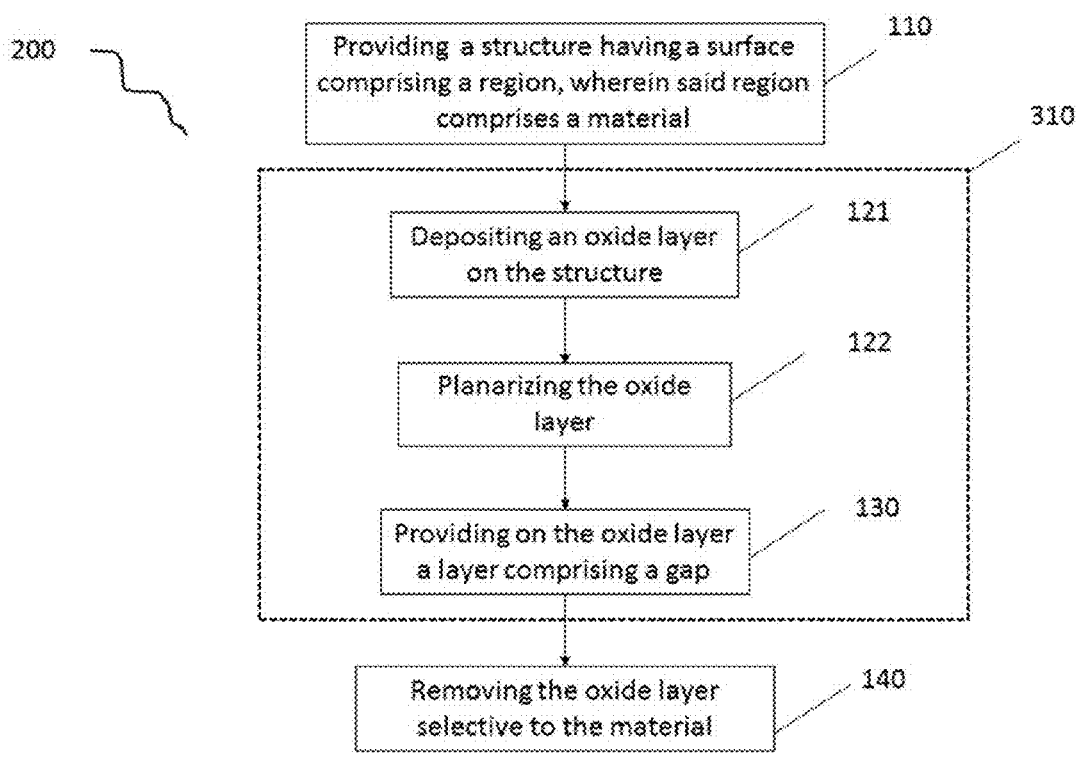
FIG. 2 is a flowchart according to a particular embodiment of the method represented in the flowchart of FIG. 1a, where a layer, comprising a gap, is provided on this oxide layer before removing this oxide layer.

FIG. 2 is a flowchart representing a method (200) according to a particular embodiment of the method represented in the flowchart of FIG. 1. The method (200) starts with providing (110) a structure (500) having a surface (10). This surface comprises a region (30). This region comprises a material (20) comprising at least silicon and at least nitrogen. In this embodiment, this structure is a semiconductor structure. This semiconductor structure is used for the manufacturing of Field Effect Transistors (FETs). Alternatively, this semiconductor structure may be useful for the manufacturing of, for example, Micro and/or Nano Electro-Mechanical Systems (MEMS and/or NEMS) or sensors. This region may refer to the complete surface of this semiconductor structure. Alternatively, this region refers to a part or to a section of the surface of this semiconductor structure.

This material may be used for different purposes, for example, as a passivation layer, as an etch-stop layer, as a hard mask, as a protective layer, as a cap layer or as a spacer material. Process conditions to deposit this material and its thickness depends on the purpose. Particularly, this material is used to function as a gate cap layer and as a spacer material. The purpose of using this material to function as a gate cap layer and as spacer material is to insulate the gate electrode of the transistor.

In a second step (310), an oxide layer (50) is provided on this structure (500). This oxide layer (50) overlies at least a part (35) of this region (30). Preferably, this oxide layer is $SiO_2$. This second step (310) comprises providing an oxide layer on the semiconductor structure, whereby this second step (310) comprises the steps of (121) and (122) as outlined in FIG. 1b.

In a third step (140), this oxide layer (50) is removed selective to this material (20) by etching. As a result of etching, at least a part (60) of this at least overlaid part (35) of this region (30) is exposed.

The method (200) further comprises, providing on the oxide layer (50), a layer (105), comprising a gap (61). This is indicated by the step (130) within the second step (310) in FIG. 2

In embodiments, providing a layer (105) comprising a gap (61) comprises first depositing a mask layer on this oxide layer. Preferably, this mask layer is a hard mask layer. Alternatively, this mask layer may be comprised of multiple layers. Then, a layer comprising patterned features is provided on this mask layer. Providing this layer comprising patterned features comprises performing at least a lithography process. Depending on the lithography process used, this layer comprising patterned features can be a photoresist layer, a spacer pattern or a component of a block co-polymer. This lithography process may be a deep ultra violet (DUV) lithography, extreme ultra violet (EUV) lithography or any one of double or multiple patterning techniques such as self-aligned-double patterning (SADP), self-aligned-quadruple patterning (SAQP) or directed self-assembly (DSA). This layer comprising patterned features is a photoresist layer when DUV or EUV is used. This layer comprising patterned features is a component of a block co-polymer when DSA is used. This layer comprising patterned features is a spacer pattern when SADP is used. Choice of the lithography process depends on the technology node and corresponding availability of the lithography process at this particular technology node. In other words this choice depends on the desired size of the structures to be produced depicted by the particular technology node.

Thereafter, pattern transfer into this mask layer (105) is done by an etch process, thereby creating this gap (61). Subsequently the layer comprising patterned features is removed.

Figure 3A:
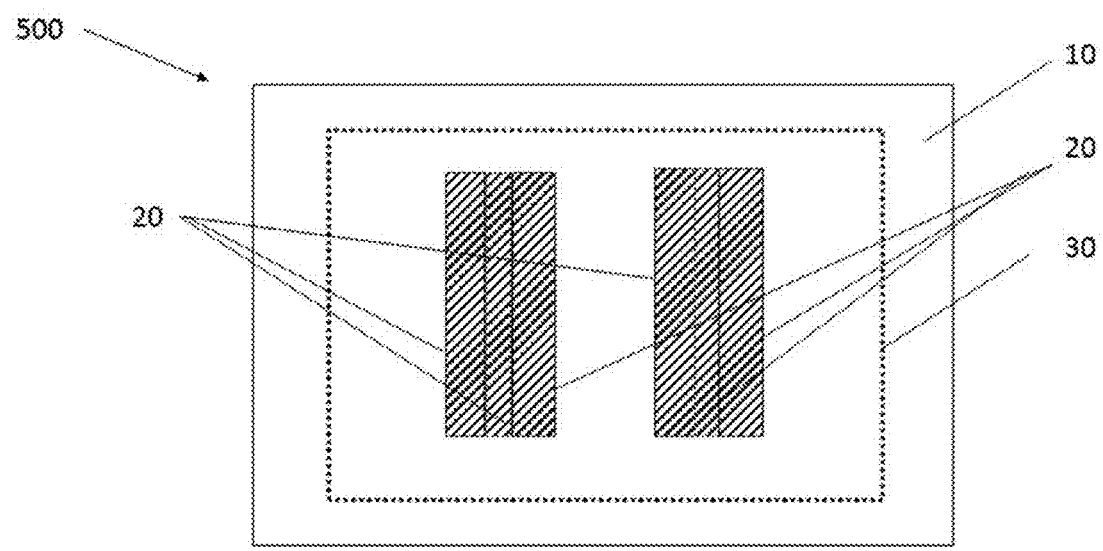
FIGS. 3a to 3c show schematically top views during a process flow for removing oxide selectively to this material according to a particular embodiment of the method represented in the flowchart of FIG. 2.
Figure 3B:
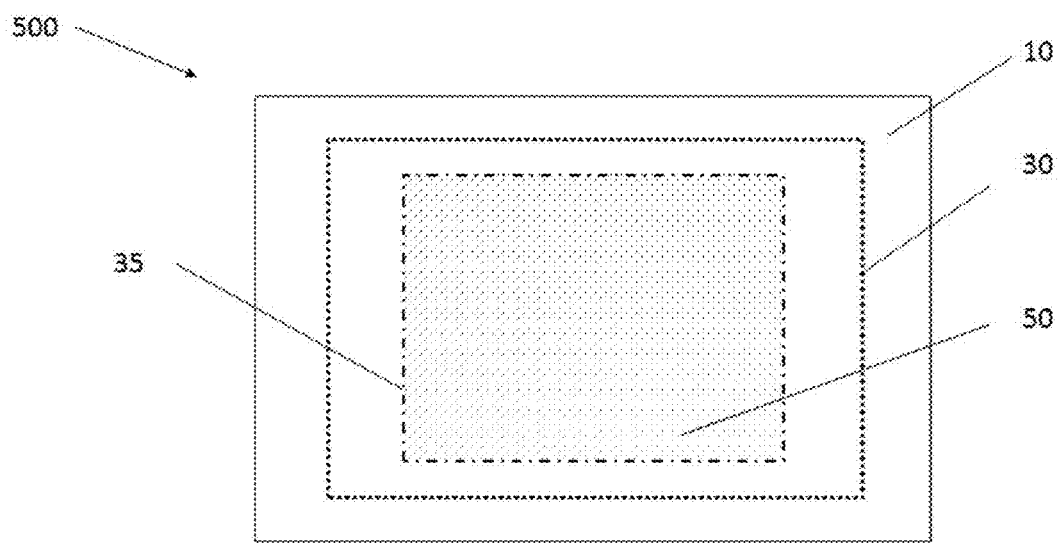
Figure 3C:
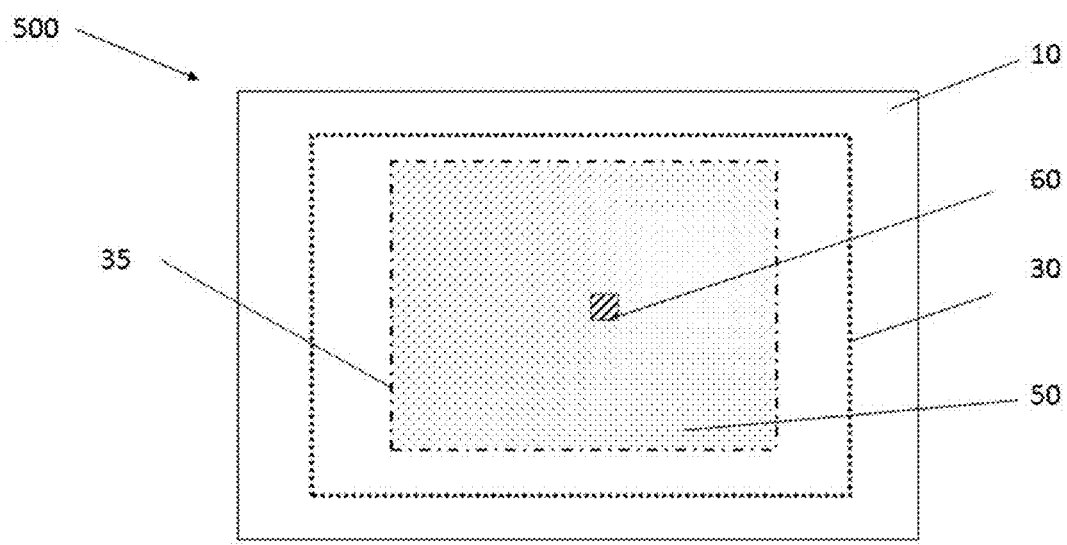

FIGS. 3a to 3c show schematic top views of process steps during a process flow for removing oxide selectively to this material according to a particular embodiment of the method represented in the flowchart of FIG. 2.

FIG. 3a shows top view of this structure (500). This structure has a surface (10). This surface comprises a region (30). This region comprises a material (20) comprising at least silicon and at least nitrogen.

FIG. 3b shows this structure (500) after an oxide layer (50) is provided on it. This oxide layer overlies at least a part of (35) of this region (30).

FIG. 3c shows this structure (500) after this oxide layer (50) is removed selective to this material (20). After this removal, at least a part (60) of this overlaid part (35) of this region (30) is exposed.

FIGS. 4a to 4e show schematic cross sections during a process flow corresponding to a method according to a particular embodiment of the method represented in the flowchart of FIG. 2.

Figure 4A:
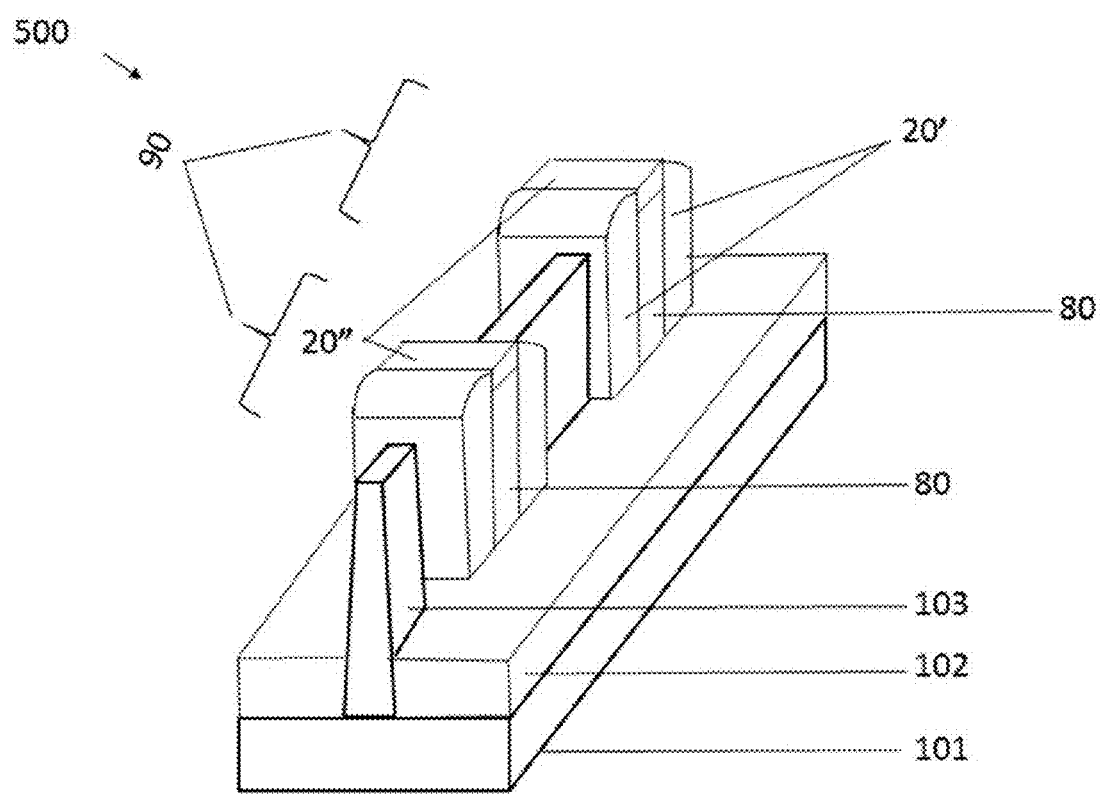
FIG. 4a show a tilted view of a structure according to a particular embodiment of the method represented in the flowchart of FIG. 2

FIG. 4a shows a tilted view of this structure (500).

Figure 4B:
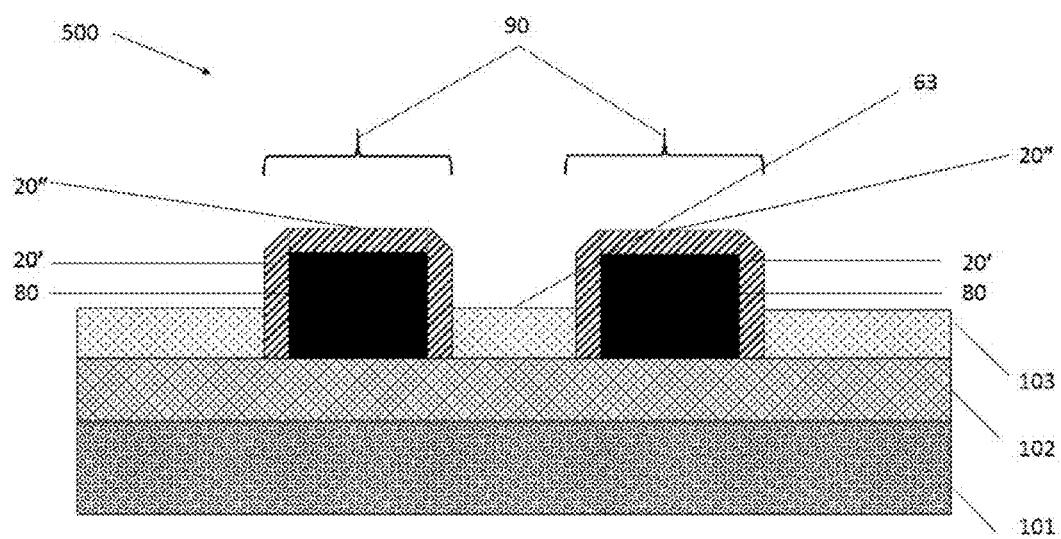
FIGS. 4b to 4e show schematic cross sections of different process steps of a method according to a particular embodiment of the method represented in the flowchart of FIG. 2.

FIG. 4b shows a cross section of this structure (500) presented in FIG. 4a. This structure is a semiconductor structure comprising a semiconductor substrate (101). This semiconductor substrate can be bulk Si, silicon on insulator (SOI) or germanium. An insulating material (102) overlies the semiconductor substrate. This insulator layer is preferably a shallow trench isolation (STI). A semiconductor feature (103) protrudes from the semiconductor substrate (101) through the insulating layer (102). This semiconductor feature is a fin. The fin may comprise a group IV element, such as silicon, germanium or a combination thereof. The fin may also comprise III-V compound such as for example, InAs. At least two multilayered structures (80) are positioned on the fin (103). These multilayered structures are gate stacks and they are separated by a contact area (63). Each of these gate stacks have an insulating cap (20") covering their top surface and insulating spacers (20') adjacent to each side wall. The insulating cap and the insulating spacers are both made from this material (20) comprising at least silicon and at least nitrogen.

Figure 4C:
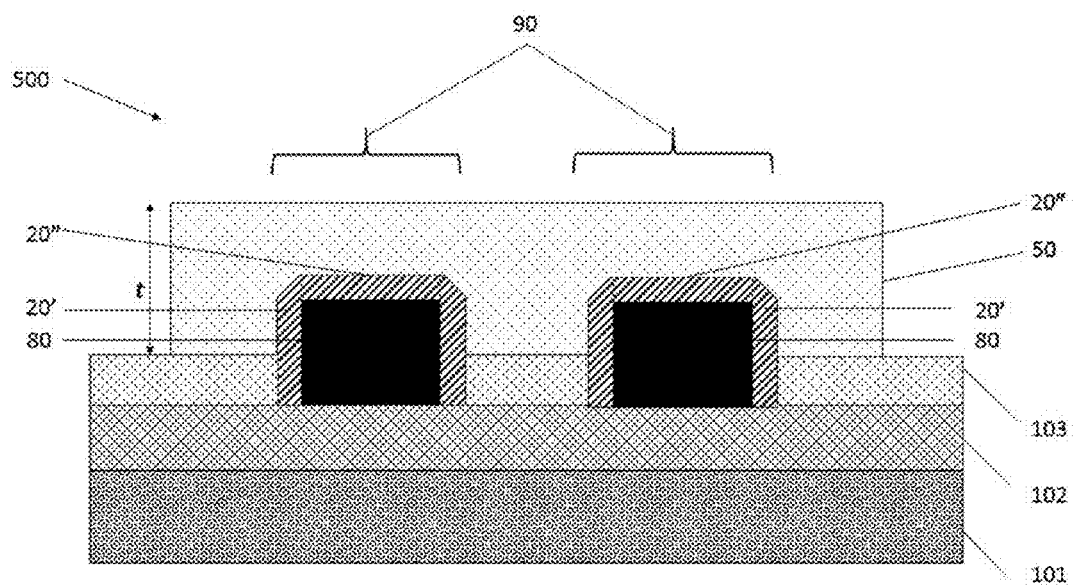

FIG. 4c shows a cross section of this structure (500) after an oxide layer (50) is provided on this structure. The oxide layer (50) is deposited on this structure. In a subsequent step, the thickness of this deposited oxide is reduced to a desired thickness value of "t" by a CMP process yielding a planar surface.

Figure 4D:
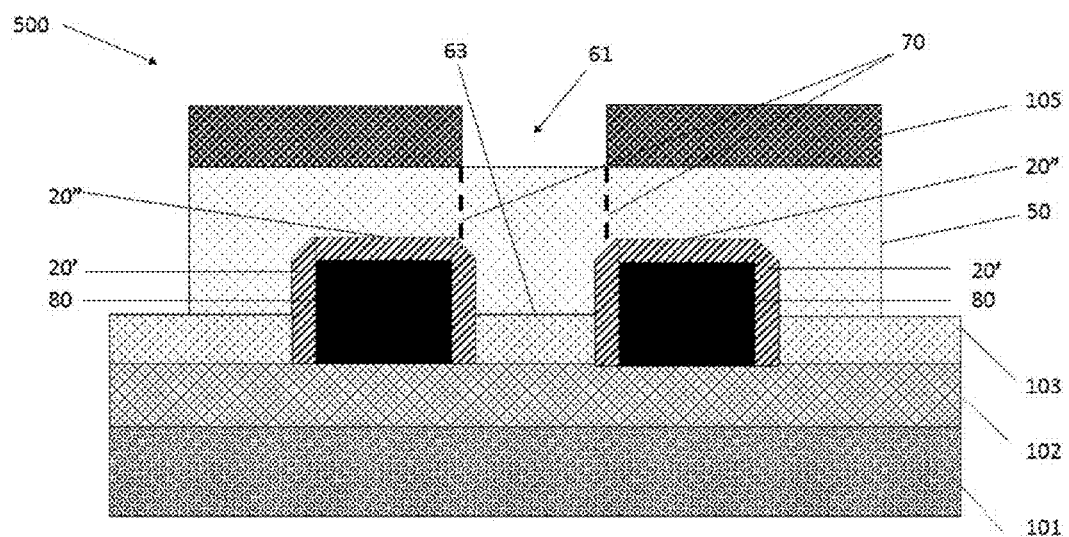

FIG. 4d shows a cross section of this structure (500) after providing a layer (105) comprising a gap (61). The projection (70) of this gap (61) coincides with at least a part of the contact area (63) and at least a part of this material. In technology nodes, where the gate pitch is bigger than 90 nm the projection of this gap coincides only a part of the contact area (63). However, as gate pitches become smaller than 60 nm, for example, for technology nodes smaller than the 22 nm technology node, this projection (70) may coincide with the complete contact area (63). Depending on the size of the gap (61), the projection (70) of the gap may also coincide with the insulating cap (20") and/or insulating spacers (20') present adjacent to the opposing sidewalls of the gate stacks (80). Coinciding of the projection (70) of this gap (61) with the insulating cap (20") and insulating spacers (20') may also occur when there is misalignment of this gap (61) (not shown in this figure) due to the lithography process. This layer (105) comprising a gap (61) is a mask layer. Typically, photoresist, amorphous carbon, TiN, can be used as mask layer. Preferably, this mask layer is a hard mask layer. Patterning of the layer (105) in order to create the gap (61) is done by a lithography process. A lithography process suitable for the technology node is chosen. For technology nodes greater than the 10 nm technology node, DUV is used. For technology nodes smaller than the 10 nm technology node, EUV is preferred. Other lithography processes that can be used instead of EUV to pattern small features are any one of double or multiple patterning techniques such as SADP or SAQP, or a newer approach called DSA.

Figure 4E:
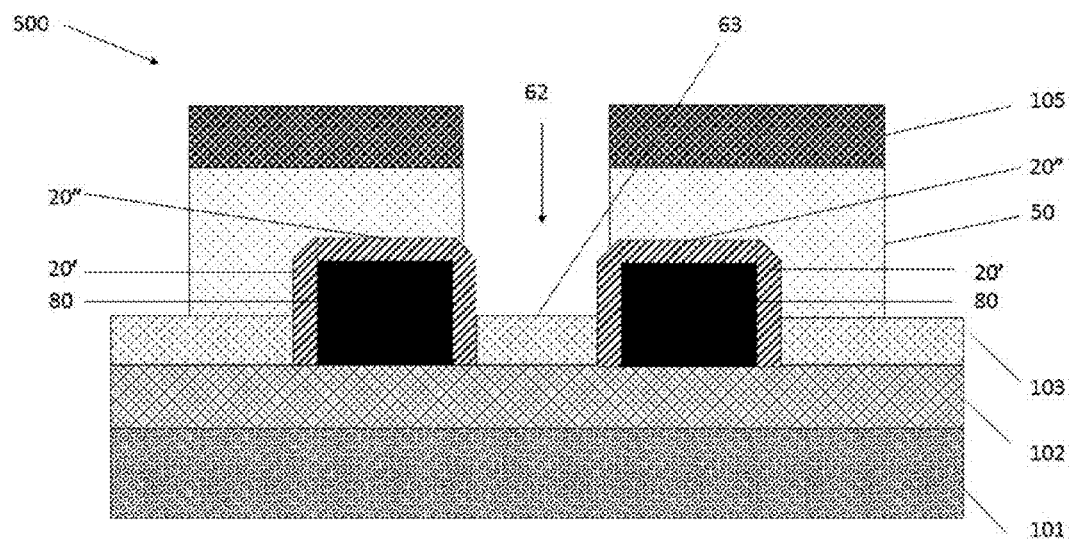

FIG. 4e shows a cross section of this structure (500) after the transfer of the pattern into the oxide layer (50) by etching the oxide layer through the gap (61). This creates a vertical opening (62) in the oxide layer (50) to the contact area (63). This vertical opening (62) is a contact hole. In a following step (not shown in the figure), this contact hole is filled with a contact metal, such as tungsten, copper or silver containing copper. As the insulating cap (20") and insulating spacers (20') is substantially preserved during the contact etch, this contact metal remains isolated from the gate stack (80).

The invention claimed is:

1. A method for removing oxide selectively to a material comprising at least silicon and at least nitrogen, the method comprising:
   (a) providing in a reactor a structure having a surface comprising a region, wherein said region comprises a material comprising at least silicon and at least nitrogen;
   (b) providing on said structure an oxide layer overlying at least a part of said region; and
   (c) removing said oxide layer selective to said material by etching, thereby exposing at least a part of said at least overlaid part of said region, wherein said etching is performed with an etchant gas comprising boron in the presence of a voltage bias lower than 30 V that is applied to the structure.

2. The method according to claim 1, wherein said etchant gas consists of a mixture of $BCl_3$ and $Cl_2$.

3. The method according to claim 1, wherein said material is selected from a group consisting of SiON, SiCN and $Si_xN_y$.

4. The method according to claim 1, wherein said structure is a semiconductor structure.

5. The method according to claim 4, wherein said removing said oxide layer comprises creating a vertical opening through said oxide layer.

6. The method according to claim 5, wherein said vertical opening is a contact hole.

7. The method according to claim 6, wherein said contact hole further exposes at least a part of a contact area located adjacent to said overlaid part of said region.

8. The method according to claim 7, wherein said etching is a self-aligned contact etch.

9. The method according to claim 8, wherein said structure is a semiconductor structure comprising:
   (i) a semiconductor substrate,
   (ii) a semiconductor feature protruding from said semiconductor substrate,
   (iii) positioned on said semiconductor feature, at least two multilayered structures separated by said contact area, each of said at least two multilayered structures having an insulating cap on top and insulating spacers adjacent to each sidewall of said multilayered structures, both the insulating cap and the insulating spacers being made from said material, and;
   wherein before step (c) removing said oxide layer, the method further comprises step (b 1) providing, on said oxide layer, a layer comprising a gap exposing said oxide layer, and
   wherein projection of said gap onto said semiconductor structure coincides with at least a part of said contact area and at least a part of said material.

10. The method according to claim 1, wherein said reactor is a capacitively coupled plasma (CCP) reactor or an inductively coupled plasma (ICP) reactor and wherein power of said reactor is pulsed.

11. The method according to claim 10, wherein a supply of said etchant gas comprising boron to said reactor is pulsed.

12. The method according to claim 1, wherein said reactor is an ion beam or a neutral beam reactor.

13. The method according to claim 1, wherein the voltage bias is lower than 10 V.

14. The method according to claim 1, wherein the pressure in the reactor during etching is in the range of 0.01 m Torr to 10 Torr.

* * * * *